United States Patent
Tokuoka et al.

[11] Patent Number: 5,256,479
[45] Date of Patent: Oct. 26, 1993

[54] FERROMAGNETIC ULTRAFINE PARTICLES, METHOD OF MAKING, AND RECORDING MEDIUM USING THE SAME

[75] Inventors: Yasumichi Tokuoka; Jiro Yoshinari, both of Saku, Japan

[73] Assignee: TDK Corporation, Tokyo, Japan

[21] Appl. No.: 856,300

[22] Filed: Mar. 23, 1992

Related U.S. Application Data

[62] Division of Ser. No. 459,124, Dec. 29, 1989.

[30] Foreign Application Priority Data

| Dec. 29, 1988 | [JP] | Japan | 63-334196 |
| Dec. 30, 1988 | [JP] | Japan | 63-331486 |
| Aug. 10, 1989 | [JP] | Japan | 1-207555 |

[51] Int. Cl.$^5$ ............ G11B 5/00; G11B 5/02; G03G 19/00
[52] U.S. Cl. ............ 428/328; 428/402; 428/694; 428/900; 360/17; 360/59; 430/39
[58] Field of Search ........... 428/694, 900, 402, 328; 430/39; 360/16, 17, 59

[56] References Cited

U.S. PATENT DOCUMENTS

| 3,611,420 | 10/1972 | Benoit | 430/39 |
| 3,631,508 | 12/1971 | Stalcopolus | 430/39 |
| 3,681,018 | 8/1972 | Knauff | 428/692 |
| 4,791,021 | 12/1988 | Honda et al. | 428/329 |
| 4,794,042 | 12/1988 | Kubota et al. | 428/328 |

FOREIGN PATENT DOCUMENTS 52-036798  3/1977  Japan.

OTHER PUBLICATIONS

Imamura, Shunji et al. "Recording Characteristics in Magnetography by Optical Writing." J. Photographic Science 32 1984, pp. 68–71.

Primary Examiner—Stevan A. Resan
Attorney, Agent, or Firm—Oblon, Spivak, McClelland, Maier & Neustadt

[57] ABSTRACT

Ultrafine particles of Fe—Co—P material with a Fe/Co atomic ratio of from 95/5 to 70/30 and a (Fe+Co)/P atomic ratio of from 85/15 to 60/40 show improved ferromagnetic properties. The average particle size is from 0.005 to 0.1 μm. Such ultrafine particles are prepared through gas phase reaction by evaporating a source material. They are useful in both magnetic and thermomagnetic recording media ensuring high density recording.

6 Claims, 8 Drawing Sheets

FERROMAGNETIC ULTRAFINE PARTICLES, METHOD OF MAKING, AND RECORDING MEDIUM USING THE SAME

This is a division of application Ser. No. 07/459,124, filed on Dec. 29, 1989.

This invention relates to ferromagnetic ultrafine particles and a method for making the same. It also relates to magnetic and thermomagnetic recording media having a recording layer containing the ferromagnetic ultrafine particles.

BACKGROUND OF THE INVENTION

Magnetic recording has an increasing range of application for audio and video recording as well as various information processing purposes. The important factors imposed on the magnetic recording media for such magnetic recording are that original signals can be recorded and reproduced as faithfully as possible and that they can store in a limited area as much information as possible. Efforts have been made for the development of improved magnetic recording medium and magnetic material in order to achieve the purposes of high fidelity, high reliability and high recording density. A similar situation is found with respect to the magnetic material intended for use in a recording layer of thermomagnetic recording media capable of high density recording such as magnetooptical recording media.

The recording wavelength should be reduced in order to increase the recording density of a magnetic recording medium. As the recording wavelength is reduced, the size of a pit being recorded becomes substantially smaller than the thickness of the medium, approaching to the size of magnetic particles. Then isotropic or perpendicular magnetizable components provide a greater contribution than longitudinal magnetizable components of the medium. For this reason, particulate or spherical particles tending to orient in an isotropic or perpendicular direction are more advantageous for high density recording than acicular particles tending to orient in a longitudinal direction of the medium.

In the manufacture of magnetic disks of the flexible type, magnetic particles are applied to a length of film stock in a longitudinal direction. The coated film is finally punched into disks which are required to have circumferentially uniform properties. For such uniformity of properties, particulate or spherical particles tending to remain randomly oriented independent of a direction of application are more advantageous than acicular particles tending to orient in a direction of application.

For magnetooptical recording medium wherein recording is generally effected in a perpendicular direction to the medium surface, particulate or spherical particles are preferred for the same reason as above.

It is thus recognized from these points of view that flakes of Ba ferrite base material are superior recording material for high density recording. Flakes of this material, however, suffer from many drawbacks that they tend to be electrically charged because they are dielectric oxide particles, that they are formed into a coating having an increased electrical resistance as the magnetic layer, and that they tend to agglomerate without dispersing because they are synthesized through heat treatment at a relatively high temperature. In addition, the flake Ba ferrite material cannot be used for optical and thermomagnetic recording because its Curie temperature is 400° C. or higher.

Nevertheless, most magnetic particles currently used for magnetic recording are of acicular or needle shape. This is partly because they have an increased coercive force. Particulate or spherical form of metallic iron ($\alpha$-Fe), for example, is not expected to have a high coercive force because its magnetocrystalline anisotropy is low. Thus acicular $\alpha$-Fe magnetic powder whose coercive force has been increased by imparting magnetic shape anisotropy is commonly used.

Metallic cobalt has a stable hexagonal structure at room temperature and relatively high magnetocrystalline anisotropy. Metallic cobalt is thus expected to produce a high coercive force even in particulate or spherical particle form if it is possible to take advantage of the high magnetocrystalline anisotropy. However, it is known from B. Szpunar, J. Magnetism of Magnetic Materials, Vol. 49 (1985), page 93 that if metallic cobalt is finely divided to a sufficient size as recording material, a face-centered cubic structure becomes stable from an energy aspect rather than a hexagonal structure affording high magnetic anisotropy. For this reason, none of currently available cobalt particles have a high coercive force as expected.

For these reasons, metallic magnetic materials based on iron or cobalt are finely divided into an acicular shape or chain structure so that an increased coercive force is available due to a shape effect.

As opposed to the metallic magnetic powders, hexagonal intermetallic compounds of Fe—Co—P series are expected to develop a high coercive force in particulate or spherical particle form because of high magnetocrystalline anisotropy.

Japanese Patent Publication No. 4755/1963, for example, discloses a permanent magnet comprising a three-component intermetallic compound (Fe,Co)$_2$P having a hexagonal crystalline structure wherein the Fe:Co ratio is up to 60:40 and the phosphorus content is from 20 to 22%.

According to this publication, the intermetallic compound is manufactured by first preparing a molten bath of phosphorus-copper (Cu 90%, P 10%). Predetermined weight proportions of electrolytic iron powder and cobalt pieces are added to the molten bath to form a bath consisting of 95% of phosphorus-copper and 5% of iron-cobalt. The molten metal is then poured into a steel mold to form a casting. The casting is leached with a weak or strong acid, obtaining (Fe,Co)$_2$P. The intermetallic compound (Fe,Co)$_2$P is available in fine particulate form according to the description of said publication. However, the compound cannot be obtained in a ultrafine particle size as defined in the present invention without an additional comminuting step. In addition, mechanical comminution generally gives particles having a poor particle size distribution and a low degree of sphericity and is difficult to produce ultrafine particles of 0.1 $\mu$m or smaller in size.

Japanese Patent Publication No. 5757/1964 discloses an improvement in the manufacture of the intermetallic compound (Fe,Co)$_2$P described in the above-cited Japanese Patent Publication No. 4755/1963 wherein the cooling rate at which the molten metal is cooled in the mold is controlled so as to increase the coercive force. The thus produced intermetallic compound particles are reported to exhibit a coercive force of 735 Oe at the maximum, much lower than a coercive force in excess of 2,000 Oe as achieved by the present invention with the equivalent composition, that is, stoichiometric composition.

In order that the intermetallic compound $(Fe,Co)_2P$ produced by the method of Japanese Patent Publication No. 5757/1964 exhibit a coercive force comparable to that of the ultrafine particles of the present invention, the method should involve an additional heat treatment as taught in said publication, resulting in an overall complicated process.

Besides, the intermetallic compound $(Fe,Co)_2P$ described in the above-cited Japanese Patent Publication Nos. 5757/1964 and 4755/1963 is less resistant to corrosion and prone to a loss of magnetic properties. In this regard, Japanese Patent Publication No. 11085/1983 proposes to improve the corrosion resistance of the intermetallic compound $(Fe,Co)_2P$ by adding Cr thereto. It discloses ferromagnetic particles comprising hexagonal metal phosphide of the formula:

$$(Fe_{(1-x-y)}Co_xCr_y)_2P$$

wherein $0.045 < \times x+y < 0.40$ and $0.005 < y < 0.10$, the particles having a mean particle size of 0.02 to 1.0 μm.

These ferromagnetic particles are produced by substantially the same method as the intermetallic compound $(Fe,Co)_2P$ particles described in the above-cited Japanese Patent Publication Nos. 5757/1964 and 4755/1963. An extra comminuting step must be added before ferromagnetic particles having a mean particle size of 0.02 to 1.0 μm can be available.

As described in Japanese Patent Publication No. 11085/1983, the ferromagnetic particles exhibit a coercive force of 200 to 500 Oe despite the inclusion of P in the stoichiometric amount. An additional heat treatment is necessary in order to increase the coercive force to 2,000 Oe.

Some known methods for the preparation of ultrafine particles of metal and alloy materials utilize a gas phase process. Known gas phase processes are vacuum evaporation processes as disclosed in Japanese Patent Publication Nos. 5149/1975, 5665/1975, 5666/1975, 21719/1977, and 44123/1980 active plasma arc evaporation processes as disclosed in Japanese Patent Publication No. 44725/1982 and Japanese Patent Application Kokai Nos. 104103/1983 and 162705/1985.

Basically, these processes are devised to heat a source ingot metal to a high temperature with an electron beam, arc plasma or the like to evaporate atoms from the metal surface, followed by condensation of the vapor for collection.

When these gas phase processes are applied to the manufacture of fine particles of hexagonal intermetallic compound of Fe—Co—P series as previously mentioned, several problems arises. First, it is difficult to continuously form a compound or composite material from such elements having greatly different melting and boiling points as Fe, Co, and P since a source ingot is melted and evaporated. Secondly, an alloy ingot used as the evaporation source is expensive.

One solution to the first problem is Japanese Patent Application Kokai No. 149705/1985, which is successful in forming a composite material from elements having different boiling points. However, this process is unsuitable for mass production because an apparatus of complex structure is necessary. In addition, this process is presumed difficult to produce hexagonal Fe—Co—P intermetallic compounds, especially ultrafine particles of hexagonal Fe—Co—P intermetallic compounds within the composition range defined in the present invention.

SUMMARY OF THE INVENTION

Therefore, an object of the present invention is to provide novel and improved ferromagnetic ultrafine particles of Fe—Co—P series having improved magnetic properties for high density recording and suitable for use in magnetic and thermomagnetic recording media.

Another object of the present invention is to provide a method for readily producing the ferromagnetic ultrafine particles.

A further object of the present invention is to provide a magnetic recording medium using the ferromagnetic ultrafine particles so that the medium has improved magnetic properties for high density recording as well as a thermomagnetic recording medium such as a magnetooptical recording medium.

According to a first aspect of the present invention, there is provided a ferromagnetic ultrafine particle comprising iron, cobalt, and phosphorus in a Fe/Co atomic ratio of from 95/5 to 70/30 and a (Fe+Co)/P atomic ratio of from 85/15 to 60/40, the particle being prepared by gas phase reaction.

According to a second aspect of the present invention, there is provided a ferromagnetic ultrafine particle comprising iron, cobalt, and phosphorus in a Fe/Co atomic ratio of from 95/5 to 70/30 and a (Fe+Co)/P atomic ratio of from 85/15 to 70/30.

According to a third aspect of the present invention, there is provided a ferromagnetic ultrafine particle comprising iron, cobalt, and phosphorus in a Fe/Co atomic ratio of from 95/5 to 70/30 and a (Fe+Co)/P atomic ratio of from 85/15 to 60/40, said particle having a coercive force of at least 2,000 Oe and a mean particle size of 0.005 to 0.1 μm.

According to a fourth aspect of the present invention, there is provided a ferromagnetic ultrafine particle comprising iron, cobalt, phosphorus, and carbon in a Fe/Co atomic ratio of from 95/5 to 70/30 and a (Fe+Co)/P atomic ratio of from 85/15 to 60/40.

According to a fifth aspect of the present invention, there is provided a ferromagnetic ultrafine particle comprising iron, cobalt, phosphorus, and nitrogen in a Fe/Co atomic ratio of from 95/5 to 70/30 and a (Fe+Co)/P atomic ratio of from 85/15 to 60/40.

According to a sixth aspect of the present invention, there is provided a method for preparing ferromagnetic ultrafine particles comprising evaporating a powder source material containing at least iron and cobalt in a gas phase in a furnace, and quenching the vapor into ferromagnetic ultrafine particles containing iron, cobalt and phosphorus.

According to a seventh aspect of the present invention, there is provided a magnetic recording medium comprising a recording layer including ferromagnetic ultrafine particles as defined above.

According to an eighth aspect of the present invention, there is provided a thermomagnetic recording medium comprising a recording layer including ferromagnetic ultrafine particles as defined above.

According to a nineth aspect of the present invention, there is provided a thermomagnetic printing medium comprising a recording layer including ferromagnetic ultrafine particles as defined above.

According to the present invention, a powder source material containing elements having different melting and boiling points separately or a compound thereof is heated with a plasma jet or the like to instantaneously evaporate the source material. The vapor is then quenched so that the source elements may chemically react with each other and with an additional element supplied from the gas phase, thereby obtaining ferromagnetic ultrafine particles based on a hexagonal $Fe_2P$ structure consisting essentially of Fe, Co, and P.

BRIEF DESCRIPTION OF THE ACCOMPANYING DRAWINGS

DETAILED DESCRIPTION OF THE INVENTION

Figure 1:
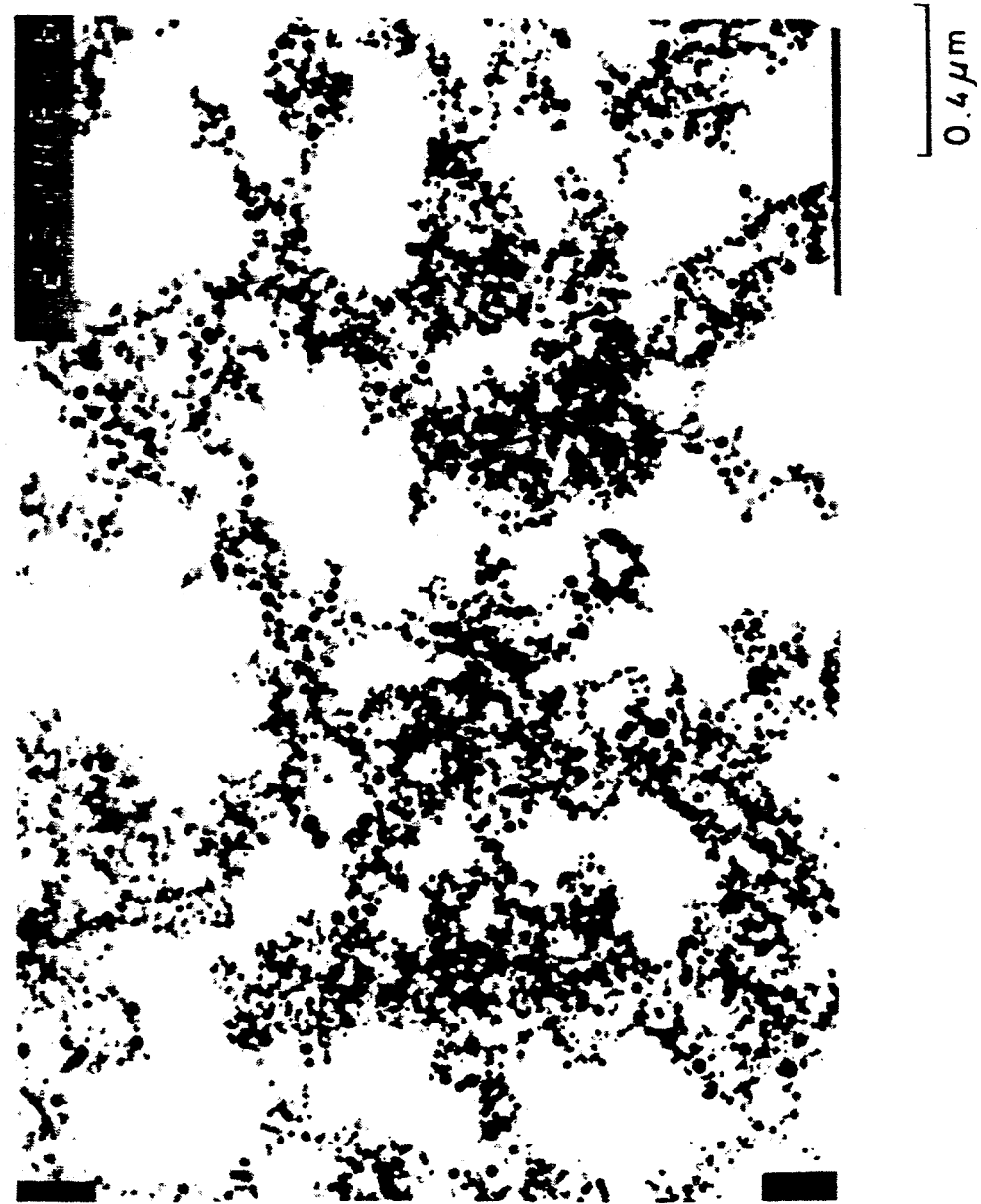
FIGS. 1 and 2 are photomicrographs of ferromagnetic ultrafine particles under a transmission electron microscope.

Briefly stated, the ferromagnetic ultrafine particles of the invention predominantly contain iron (Fe), cobalt (Co), and phosphorus (P) and generally has a hexagonal $Fe_2P$ structure.

The ultrafine particles each contain these elements in the specific contents.

The ultrafine particles contain iron and cobalt in an atomic ratio Fe/Co of from 95/5 to 70/30, preferably a Fe/Co ratio of from 90/10 to 80/20. If the content of Co relative to Fe is less than the above-defined range, a considerable lowering of Curie temperature will result in a reduction of coercive force to about 500 Oe or lower at room temperature. If the content of Co relative to Fe is more than the above defined range, a lowering of magnetocrystalline anisotropy will also result in a reduction of coercive force to about 500 Oe or lower.

The ultrafine particles contain iron, cobalt, and phosphorus in an atomic ratio (Fe+Co)/P of from 85/15 to 60/40, preferably from 80/20 to 65/35. If the content of P relative to Fe plus Co is less than the above-defined range, the contribution of P to magnetocrystalline anisotropy is reduced, resulting in a coercive force of 500 Oe or lower.

The hexagonal $Fe_2P$ structure of the stoichiometric composition dictates a theoretical P content of approximately 33 atom %. It is generally believed that no single phase $Fe_2P$ structure results from a P content of 30 atom % or lower. Nevertheless, the method of the invention as will be described later enables ultrafine particles to be produced while maintaining a single phase hexagonal $Fe_2P$ structure within the P content range of from 30 to 15 atom %, that is, an atomic ratio (Fe+Co)/P of from 85/15 to 70/30. Though the invention is not bound to the theory, it is supposed that since ultrafine particles are synthesized by quenching from a vapor state at elevated temperatures, a hexagonal structure which is stable at elevated temperatures is frozen intact. When the P content is lower than the stoichiometric composition, there is a possibility that lattice points of P are left vacant. An alternative structure is one in which lattice points of P are replaced by another element which is added to the source material or to the gas phase during the reaction process, for example, C, N, Si, Sn, B, Ni, Zn, Ti, Mn, Al, and Cr.

When the P content exceeds the stoichiometric composition, the ultrafine particles contain excess phosphorus. Within the above-defined range, such excess phosphorus does not introduce a substantial change in x-ray diffraction pattern or adversely affect magnetic properties. However, much excess phosphorus beyond the above-defined range (40 at %) undesirably results in a lowering of saturation magnetization to 35 emu/g or lower.

The ultrafine particles may contain C and/or N in addition to the essential elements, Fe, Co, and P.

These additional elements, carbon and nitrogen are taken into the ultrafine particles from the powder source material, a material of which the reaction furnace is made, or an atmosphere in the reaction furnace. They have a function of stabilizing the hexagonal $Fe_2P$ structure.

More particularly, inclusion of carbon is effective in lowering the electric resistance and improving the dispersion of ultrafine particles. When the source material is an oxide, the presence of carbon during reaction is effective in evaporating the source material while reducing it. Then the oxide source material can be reduced with only nitrogen gas into a phosphide without using hazardous hydrogen. Further, C and N prevent ultrafine particles from fusion bonding together to form a chain structure during formation thereof and at the same time, improve the corrosion resistance of ultrafine particles.

Carbon and nitrogen may be present alone or in admixture in ultrafine particles. The preferred carbon content is up to 20% by weight, more preferably from 0.1 to 10% based on the weight of ultrafine particles. The preferred nitrogen content is up to 10% by weight, more preferably from 0.1 to 5% based on the weight of ultrafine particles. When the C and N contents exceed the above-defined ranges, saturation magnetization would lower.

The majority of Fe, Co, and P forms a hexagonal $Fe_2P$ structure in ultrafine particles. Thus the ultrafine particles exhibit a high coercive force and a low Curie temperature. The presence of a hexagonal $Fe_2P$ structure can be identified by x-ray diffraction analysis.

The ultrafine particles may include some $Fe_3P$ or $\alpha$-Fe structure in addition to the hexagonal $Fe_2P$ structure insofar as the magnetic properties are not adversely affected thereby.

The composition of ultrafine particles can be measured by plasma emission spectrometry, elemental analysis for C, H, and N, fluorescent x-ray analysis, and other chemical analysis techniques.

In addition to the above-mentioned elements, the ultrafine particles may optionally contain additive elements such as Si, Sn, B, Ni, Zn, Ti, Mn, Al, and Cr.

The ultrafine particles of the invention are of substantially spherical shape which can be identified by means of a transmission electron microscope.

The ultrafine particles preferably have a mean particle size or diameter of 0.005 to 0.1 $\mu$m, more preferably 0.01 to 0.05 $\mu$m. With respect to the above-defined range, smaller particles would behave more like superparamagnetic ones, resulting in a substantial loss of coercive force. Larger particles tend to agglomerate and are rather difficult to disperse.

The method of the invention, which will be described later, can produce ultrafine particles of such a mean particle size in discrete substantially spherical form without a need for additional comminution and other means. There can be readily produced well dispersible ferromagnetic ultrafine particles.

The ultrafine particles of the invention preferably has a coercive force of at least 500 Oe, more preferably at least 800 Oe, most preferably at least 2,000 Oe, especially from 2,100 to 5,000 Oe and are thus useful in thermomagnetic transfer recording with a short wavelength. The particles preferably have a saturation magnetization of at least 35 emu/g, more preferably 50 to 80 emu/g.

The ultrafine particles preferably have a Curie temperature of 80° to 200° C., more preferably 90° to 160° C. and are thus useful in thermomagnetic transfer recording.

The method of the invention, which will be described later, can produce ultrafine particles basically having a hexagonal $Fe_2P$ structure throughout the above-defined composition range of Fe—Co—P while controlling their coercive force and Curie temperature within the above defined range so as to meet a particular application.

Now the method for producing such ultrafine particles according to the invention will be described.

The ultrafine particles are desirably prepared by gas phase reaction.

One gas phase reaction method involves evaporating a powder source material containing at least Fe and Co in a gas phase and quenching the vapor into ultrafine particles.

The powder source material may contain iron and cobalt either in elemental form or in the form of compounds such as oxides, phosphides and phosphates. A mixture of elements and compounds may also be used. The type of compound used is not critical although iron oxide, cobalt oxide, and iron phosphate are preferred.

Phosphorus may be either contained in the powder source material or introduced into the gas phase. When the powder source material contains phosphorus, it may be present as either an element or a compound, or in admixture thereof. The type of phosphorus compound used is not critical although ammonium phosphate, iron phosphate, cobalt phosphate, and phosphorus oxide are preferred. Alternatively, phosphorus may be introduced into the gas phase by introducing a P source material, for example, a hydrogen phosphide gas such as phosphine into the reaction system.

In order that ultrafine particles contain C and/or N, the respective elements may be either contained in the powder source material or introduced into the gas phase. It is also possible to supply these elements from the material of which the reaction furnace is made.

When the carbon and nitrogen elements are supplied from the powder source material, the preferred carbon and nitrogen sources may be carbon black and ammonium salts. For the supply from the gas phase, carbon may be introduced by adding CO, various hydrocarbons or carbonyl compounds to the carrier gas. Nitrogen may be introduced by using nitrogen gas as a plasma gas or adding nitrogen or $NH_3$ to the carrier gas.

In addition to the above-mentioned elements, the powder source material may further contain any additive element as previously described, also as an element, alloy, compound, or mixture.

The above-mentioned essential and optional elements and additive elements may be contained in the powder source material in such a proportion as to establish a desired proportion in the resulting ultrafine particles.

As the mixture containing the above-mentioned elements, scraps, ore, mill scales or the like may be used if desired. The method of the invention permits ultrafine spherical particles having improved magnetic properties to be produced even from such a low cost starting material.

The powder source material containing above-mentioned elements preferably consists of particles with a mean particle size of up to 100 $\mu$m, especially up to 10 $\mu$m. The use of starting particles with such a particle size provides for efficient evaporation of Fe, Co and the like, ensuring a quantitative supply of the elements to the reaction zone.

The source material particles of such a size may be prepared by finely dividing and milling stock materials of the above-mentioned elements or compounds by any well-known milling means such as a ball mill and jet mill.

In order that the source material particles be more free flowing, granulation of the source material with a known binder may be employed, with spray drying being desirable for granulation. The binder used to this end is not critical although the preferred binders are polyvinyl alcohol, polyvinyl pyrrolidone, and ethyl cellulose.

In the reactor furnace, the powder source material is heated in a gas phase whereby the individual source material particles are instantaneously evaporated and the vapor is quenched and condensed into ultrafine particles. Preferably, the reaction system may be an inert or reducing atmosphere under the atmospheric pressure or lower.

The heating means used herein may be any desired heating means which can instantaneously evaporate source material particles although the use of a thermal plasma, especially a plasma jet is preferred.

Means for generating a plasma jet may be, for example, a DC plasma generating means. A DC arc discharge is generated between the inside of a convergent end of a nozzle shaped anode and a pointed end of a cathode inside the anode. The arc discharge heats a plasma gas supplied through the anode to ultrahigh temperatures, forming a thermal plasma. The thermal plasma is ejected through the anode nozzle as a jet.

A plasma jet may also be generated using an induction coupling plasma (ICP). A gas is passed through a quartz tube having a coil wound thereon while a high frequency current is conducted across the coil to produce a high frequency magnetic field across the tube. Then a plasma is inductively generated in the gas.

The source material particles can be simultaneously heated and evaporated by placing the particles in such a plasma jet.

Figure 3:
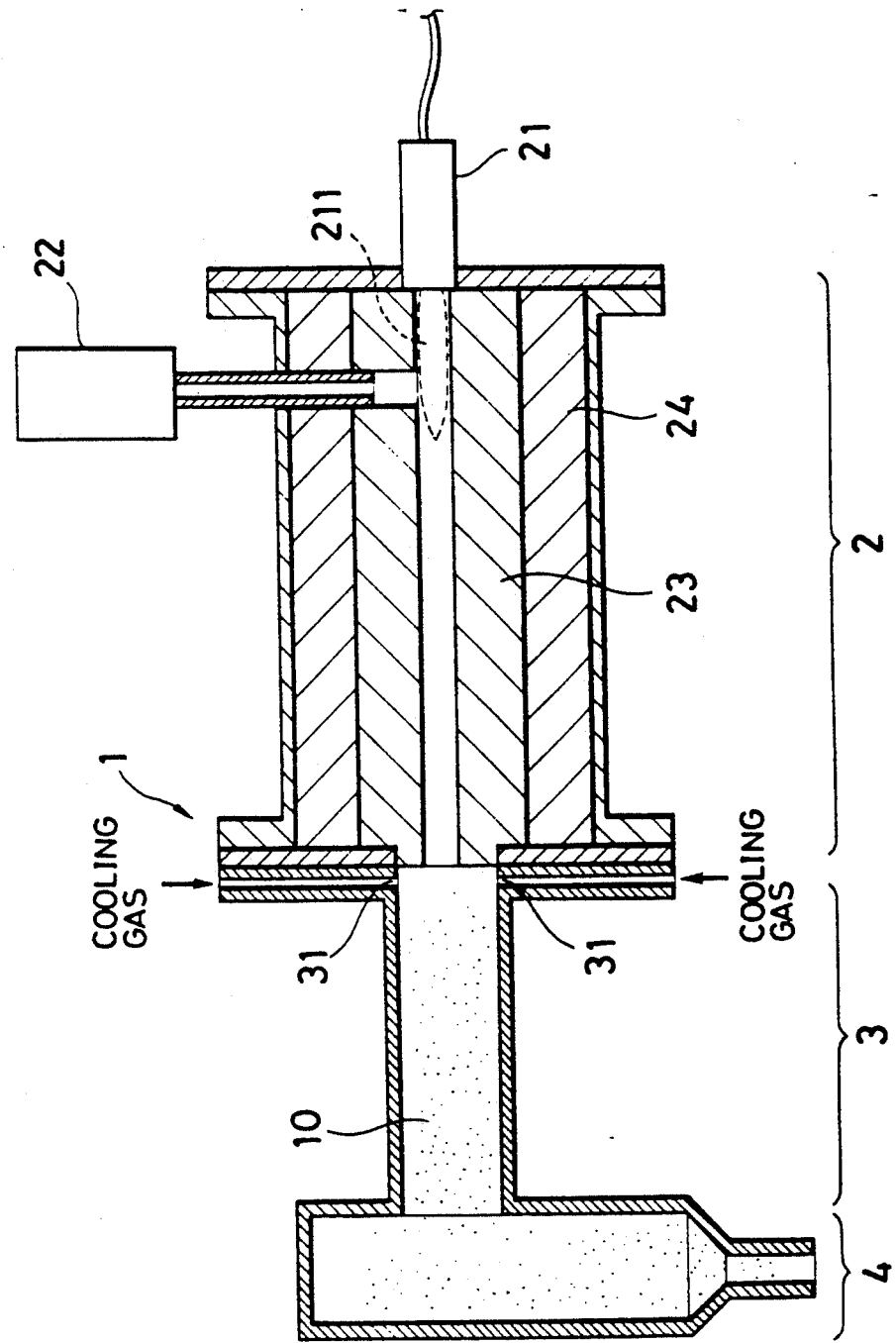
FIG. 3 is a schematic axial cross section of a reactor furnace using a DC plasma as one preferred example of an apparatus for preparing ultrafine particles according to the present invention.
Figure 4:
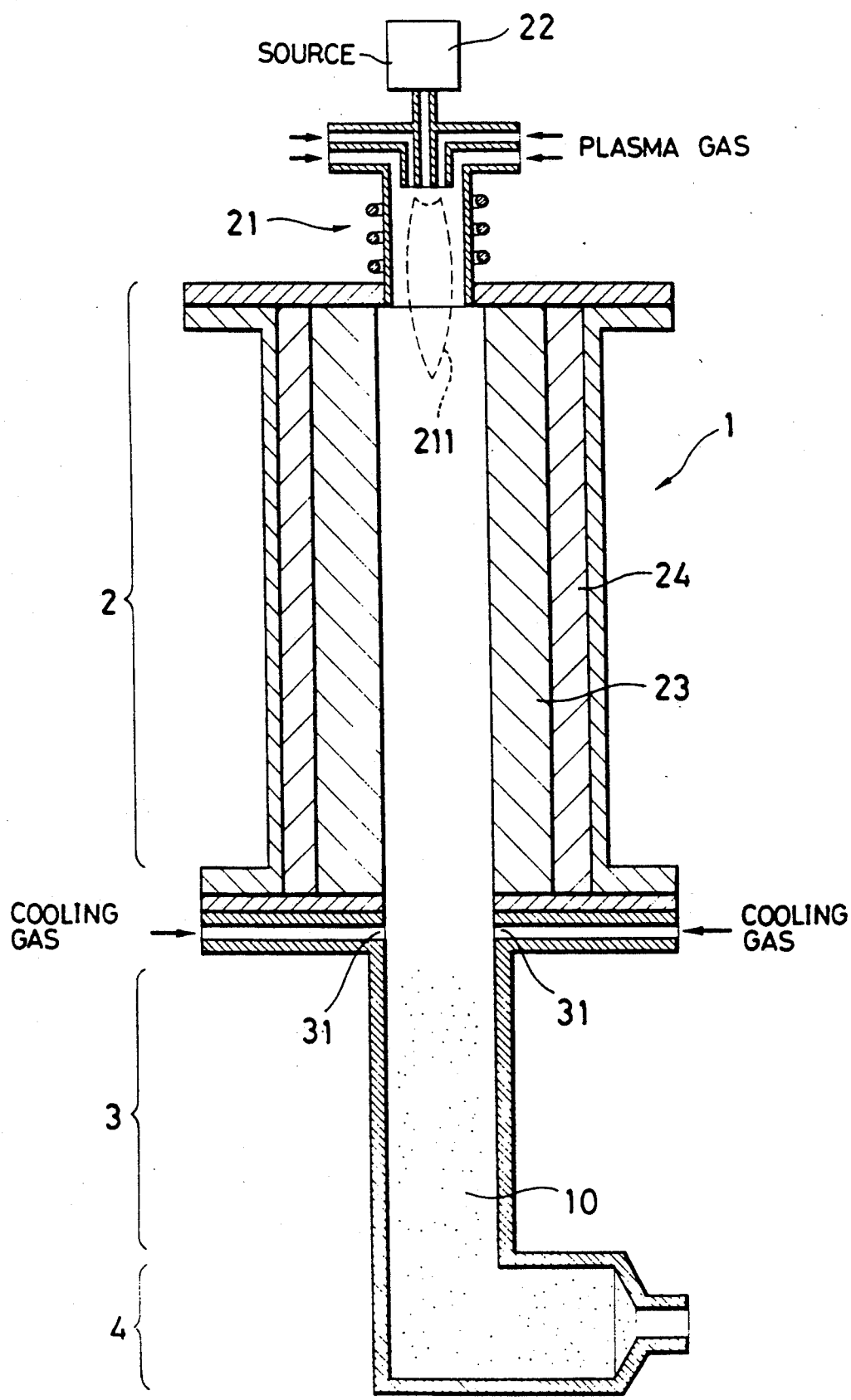
FIG. 4 is a schematic axial cross section of a reactor furnace using an induction coupling plasma as another preferred example of an apparatus for preparing ultrafine particles according to the present invention.

FIGS. 3 and 4 illustrate preferred embodiments of apparatus for preparing ultrafine particles according to the invention.

In FIGS. 3 and 4, a reaction furnace 1 includes an evaporating section 2, a cooling section 3, and a collecting section 4 series connected in this order. The evaporating section 2 includes means 21 for generating a plasma jet 211. The plasma jet generating means 21 uses a DC plasma generator in FIG. 3 and an ICP generator in FIG. 4.

Supply means 22 supplies a powder source material along with a carrier gas into the plasma jet 211. Since the plasma gas at ultrahigh temperatures flows at an extremely high velocity in the DC plasma configuration illustrated in FIG. 3, the powder source material is readily bounced back at the outer perimeter of a high velocity jet flame without reaching the center of the plasma. For this reason, the inner wall of the furnace evaporating section 2 is dimensioned to be in close proximity to the plasma flame to maintain the entire chamber at high temperatures, and the plasma is maintained in turbulent state whereby the residence time of source material particles at high temperatures is prolonged. The inner wall of the furnace evaporating section 2 is thus covered with a refractory material 23 which may be selected from graphite, boron nitride, tungsten, and other refractory alloy materials. When the refractory inner wall 23 is of carbonaceous material such as graphite, it can be a source for supplying carbon to ultrafine particles. The refractory inner wall 23 is enclosed in a heat insulating wall 24 which may be formed from carbon fibers, alumina, and zirconia, for example. The double wall structure of refractory material 23 and heat insulator 24 is effective in keeping heat within the evaporation zone. Preferably, the inner wall of the evaporating section 2 is maintained at a high temperature of at least 1,000° C.

As compared with the DC plasma, the induction coupling plasma (ICP) produces a plasma flame having a larger diameter and a lower velocity. In addition, the ICP allows the powder source material to be supplied along a central axis of the plasma. Thus the powder source material can stay longer in the plasma at high temperatures. The inner wall of the reactor furnace shown in FIG. 4 is increased in diameter and thus decreased in temperature, ensuring efficient evaporating reaction without causing introduction of foreign matter. Therefore, in the embodiment of FIG. 4, the supply means 22 is disposed in alignment with the plasma jet generating means 21 whereby the powder source material is directly delivered to the center of the plasma jet 211.

The vapors resulting from evaporation of the powder source material in the evaporating section 2 are conveyed to the cooling section 3 by a carrier gas and a plasma gas.

Ports 31 are disposed at the interface between the evaporating and cooling sections 2 and 3 for supplying a cooling gas with which the vapors are quenched and condensed into ultrafine particles 10. The carrier gas flow along with the plasma gas and the cooling gas further conveys the ultrafine particles 10 to the collecting section 4 where a mass of ultrafine particles is discharged out of the furnace 1.

The resulting ultrafine particles are substantially spherical particles in monodispersion state free of fusion bond or chain-like interconnection of particles.

The plasma gas, cooling gas, and carrier gas for conveying the powder source material and the vapor thereof may be one or more members suitably selected from Ar, $H_2$, He, $N_2$, $NH_3$, CO and various hydrocarbons. The plasma gas is preferably an Ar/$H_2$ mixture, Ar/$N_2$ mixture, or $N_2$/$H_2$ mixture. The cooling gas is preferably $H_2$, $N_2$ or $NH_3$. When it is desired to introduce C or N in ultrafine particles, any suitable gas for the purpose may be selected from the foregoing examples.

The magnetic or thermomagnetic recording medium of the invention contains the ultrafine particles in a recording layer as magnetic or thermomagnetic recording material. In these applications, the ultrafine particles are often mixed with any well-known binder and other additives and coated on a nonmagnetic substrate to form a so-called coated medium.

The binder in which the ultrafine particles are dispersed is not critical and may be selected from binders commonly used for conventional coated magnetic recording media. In the case of thermomagnetic recording medium, the binder should be resistant against heat. Preferred examples of the binder include vinyl chloride-vinyl acetate copolymers, polyvinyl butyral resins, cellulosic resins, polyurethane resins, polyester resins, epoxy resins, phenol resins, melamine resins, polyvinyl phenol resins, and isocyanate compounds. The binder is used in amounts of 10 to 100 parts per 100 parts by weight of the magnetic material.

The magnetic material (ultrafine particles), binder and additives are milled along with a suitable solvent to form a magnetic coating composition, which is applied to a nonmagnetic substrate. The magnetic coating is then subjected to orientation in a magnetic field, dried, and calendered, obtaining a magnetic recording medium.

Since the ultrafine particles are substantially spherical in shape, the orientation in a magnetic field causes the particles to orient with their easy axis of magnetization aligned with the external magnetic field direction. Thus the particles can be readily oriented in a direction perpendicular to the magnetic layer surface. The perpendicular orientation provides for efficient utilization of a perpendicular magnetizable component, resulting in a magnetic recording medium having improved recording and printing properties at a short wavelength.

The magnetic layer may be of a multi-layer structure including two or more layers. In this case, the outer magnetic layer or layers which are located on the side of a magnetic head should preferably contain ultrafine particles with their easy axis of magnetization oriented in a direction perpendicular to the layer surface because short wavelength components are predominantly recorded or printed (or transferred) in the outer magnetic layer. In turn, the inner magnetic layer or layers which are located adjacent the nonmagnetic substrate should preferably contain ultrafine particles with their easy axis of magnetization oriented in a direction parallel to the layer surface because long wavelength components are predominantly recorded or printed in the inner magnetic layer. In the multi-layer structure, the ultrafine particles in the respective magnetic layers may have different magnetic properties such as coercive force.

The nonmagnetic substrate on which the magnetic layer is formed is not critical. Flexible plastic films used in conventional magnetic tape and floppy disks may be employed as well as rigid substrates such as aluminum alloy and glass. The shape and dimensions of the nonmagnetic substrate are not critical. For example, a disk or tape shape may be selected according to the intended application.

It is not critical how to carry out recording in the magnetic recording medium of the invention. Any suitable method may be selected from conventional magnetic recording, thermomagnetic recording, and thermomagnetic printing methods.

The thermomagnetic printing or transfer medium is adapted for thermomagnetic printing of a magnetic recording medium having short wavelength signals recorded therein, for example, for the mass reproduction of video tape.

In general, the printing method requires that signals in the master tape be mirror images to signals in the slave tape. This means that a VCR for master tape recording must be a VCR for mirror image signal recording, known as a mirror VCR. Since the printing medium according to the present invention has a magnetic layer containing ultrafine particles having a low Curie temperature and an extremely high coercive force at room temperature, signals may be thermomagnetically printed from an ordinary tape having positive images recorded therein to the printing medium as mirror images, which may be used as the master tape for contact magnetic printing. Such use of the printing medium of the invention as so-called inter-tape can avoid the use of a mirror VCR.

EXAMPLE

Examples of the invention are given below by way of illustration and not by way of limitation.

EXAMPLE 1

A mixture of iron oxide powder, cobalt oxide powder, and iron phosphate powder was milled and granulated by spray drying, obtaining a powder source material.

The powder source material was introduced into a reaction furnace as shown in FIG. 3 or 4 which was operated to produce a plasma jet whereby the material was evaporated into a vapor. The vapor was quenched and condensed with a cooling gas, obtaining ultrafine particles.

Table 1 shows the atomic ratios Fe/Co and (Fe+Co)/P and mean particle size of the powder source material, the plasma gas and plasma power, and the cooling gas. The plasma jet was generated by DC plasma for sample Nos. 4 and 5 and by ICP for the remaining samples.

Table 1 also shows the atomic ratios Fe/Co and (Fe+Co)/P, mean particle size, predominant crystalline structure, coercive force Hc at 25° C., saturation magnetization $\sigma s$, squareness ratio SQ, and Curie temperature Tc of the ultrafine particles.

The atomic ratios Fe/Co and (Fe+Co)/P were determined by plasma emission spectrometric analysis, the mean particle size by means of a transmission electron microscope, and the crystalline structure by x-ray diffraction analysis. The coercive force, saturation magnetization, and squareness ratio were determined by means of a vibrating sample magnetometer (VSM) at room temperature under an applied magnetic field of 10 kOe.

FIG. 1 shows the photomicrograph of sample No. 1 under a transmission electron microscope.

Figure 5:
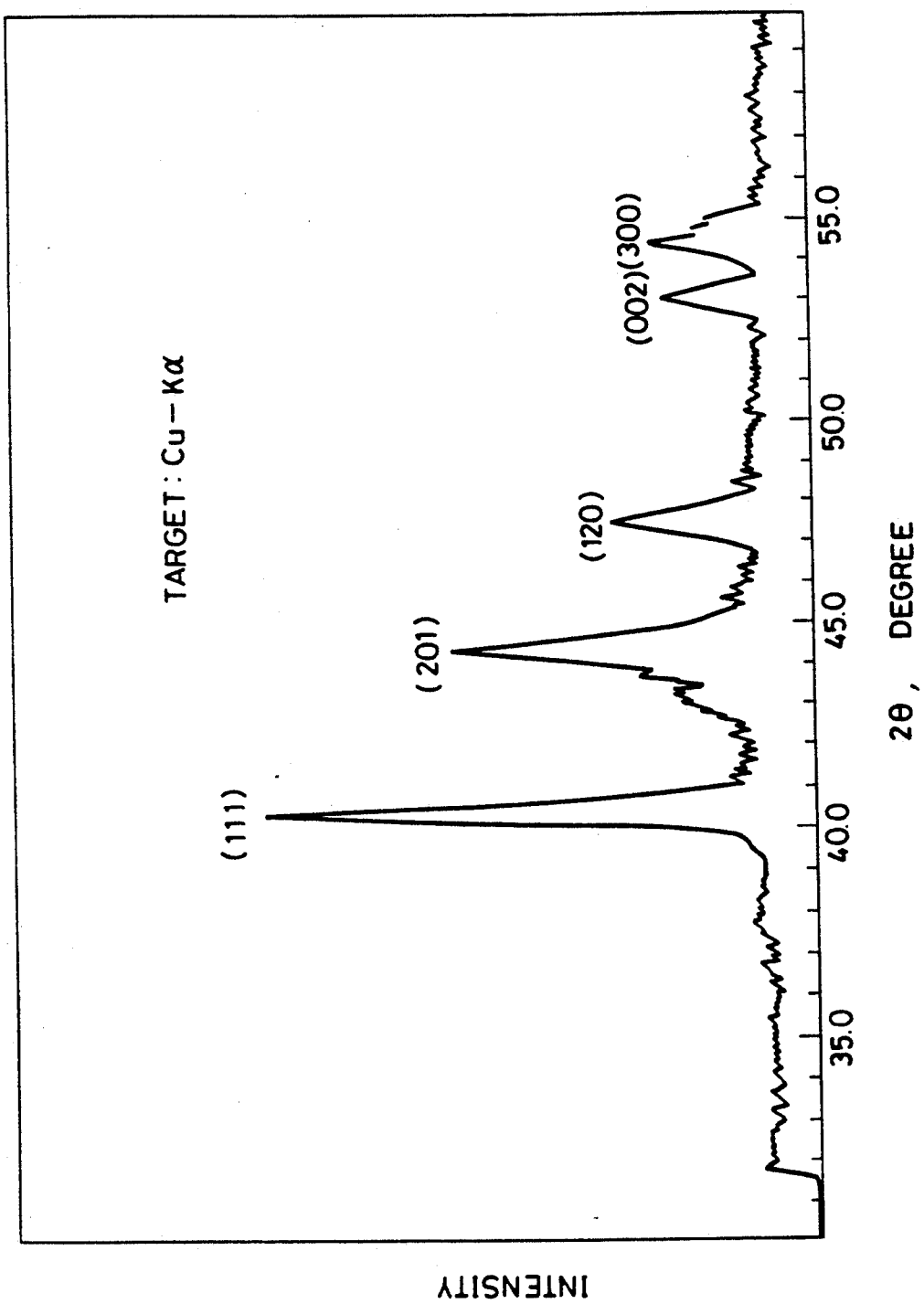
FIGS. 5 and 7 are x-ray diffraction diagrams of ferromagnetic ultrafine particles according to the present invention.

FIG. 5 is a x-ray diffraction pattern of sample No. 3.

Figure 6:
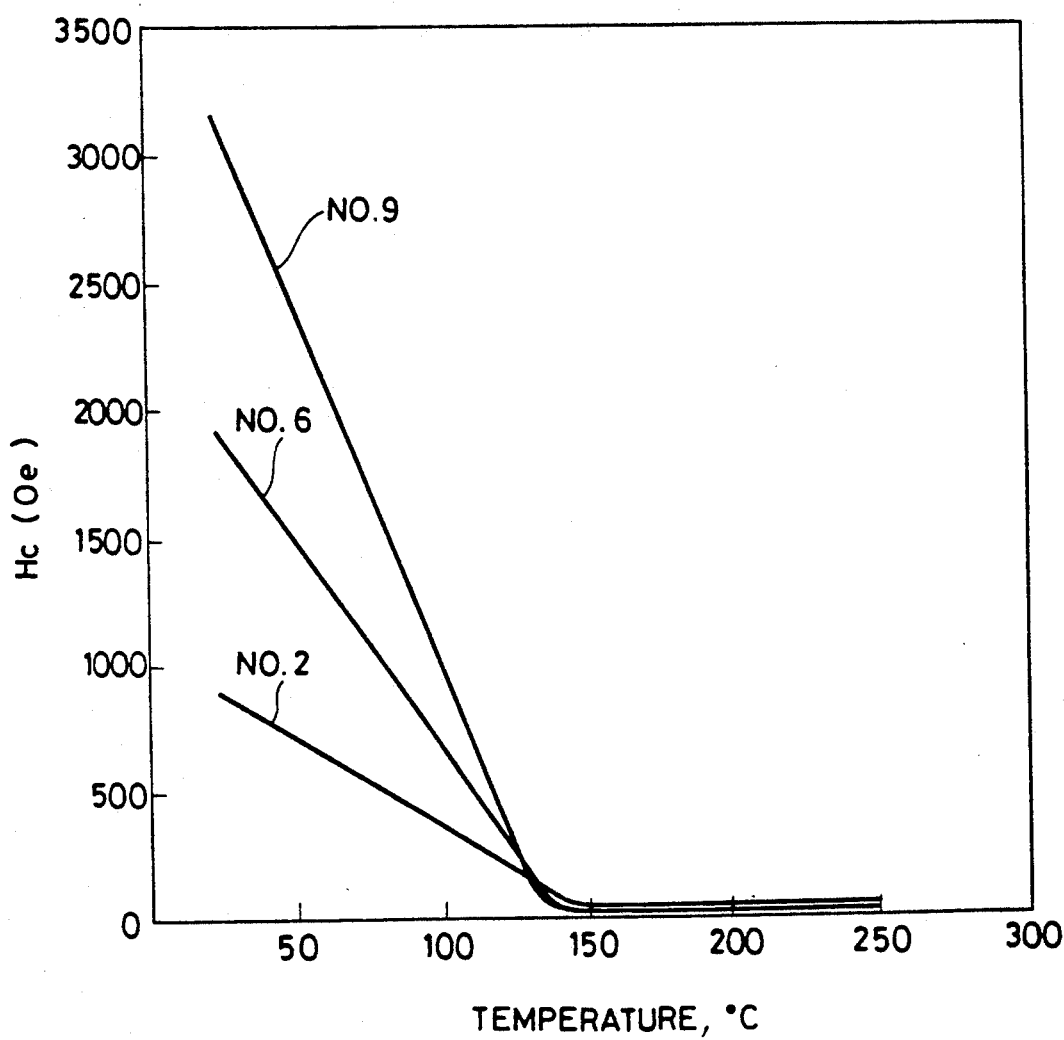
FIGS. 6 and 8 are diagrams showing the coercive force of ferromagnetic ultrafine particles according to the present invention as a function of temperature.

FIG. 6 shows the coercive force of sample Nos. 2, 6, and 9 as a function of temperature.

TABLE 1

| Sample No. | Powder source material | | | | | | Ultrafine particles | | | | | | | |
|---|---|---|---|---|---|---|---|---|---|---|---|---|---|---|
| | Composition | | Particle size (μm) | Plasma | | Cooling gas | Composition | | Crystal structure | Hc (Oe) | $\sigma_s$ (emu/g) | SQ | Particle size (Å) | Tc (°C.) |
| | Fe/Co | (Fe + Co)/P | | Power (KW) | Gas | | Fe/Co | (Fe + Co)/P | | | | | | |
| 1 | 85/15 | 81/19 | 10 | 40 | Ar + H₂ | H₂ | 85/15 | 82/18 | Fe₂P | 560 | 90 | 0.37 | 280 | 160 |
| 2 | 85/15 | 80/20 | 10 | 40 | Ar + H₂ | H₂ | 85/15 | 80/20 | Fe₂P | 900 | 70 | 0.45 | 305 | 145 |
| 3 | 85/15 | 78/22 | 10 | 40 | Ar + H₂ | H₂ | 85/15 | 78/22 | Fe₂P | 1010 | 73 | 0.48 | 310 | 145 |
| 4 | 85/15 | 76/24 | 10 | 20 | Ar + H₂ | H₂ | 85/15 | 75/25 | Fe₂P | 1250 | 67 | 0.48 | 250 | 145 |
| 5 | 85/15 | 75/25 | 10 | 20 | Ar + H₂ | H₂ | 85/15 | 74/26 | Fe₂P | 1300 | 60 | 0.49 | 350 | 140 |
| 6 | 85/15 | 71/29 | 10 | 40 | Ar + H₂ | H₂ | 86/14 | 72/28 | Fe₂P | 1930 | 61 | 0.53 | 305 | 140 |
| 7 | 85/15 | 70/30 | 10 | 40 | Ar + H₂ | H₂ | 85/15 | 70/30 | Fe₂P | 2680 | 59 | 0.55 | 295 | 135 |
| 8 | 85/15 | 67/33 | 10 | 40 | Ar + H₂ | H₂ | 85/15 | 67/33 | Fe₂P | 3900 | 40 | 0.58 | 280 | 135 |
| 9 | 85/15 | 61/39 | 10 | 40 | Ar + H₂ | H₂ | 85/15 | 62/38 | Fe₂P | 3200 | 35 | 0.57 | 285 | 135 |
| 10 | 90/10 | 76/24 | 10 | 40 | Ar + H₂ | H₂ | 90/10 | 76/24 | Fe₂P | 1130 | 65 | 0.47 | 295 | 90 |
| 11 | 70/30 | 76/24 | 10 | 40 | Ar + H₂ | H₂ | 70/30 | 76/24 | Fe₂P | 820 | 60 | 0.40 | 280 | 120 |
| 101* | 85/15 | 89/11 | 10 | 40 | Ar + H₂ | H₂ | 85/15 | 88/12 | Fe₃P + αFe | 300 | 105 | 0.26 | 270 | 430 |

*outside the scope of the invention

EXAMPLE 2

A magnetic tape was manufactured which had a magnetic layer containing ultrafine particles identified as sample No. 4 in Table 1.

A magnetic coating composition was prepared by adding the following ingredients:

| | parts by weight |
|---|---|
| ultrafine particles | 400 |
| vinyl chloride-vinyl acetate resin | 50 |
| urethane resin | 50 |
| stearic acid | 2 |
| butyl stearate | 2 | to 300 parts by weight of methyl ethyl ketone (MEK), 250 parts by weight of methyl isobutyl ketone (MIBK), and 250 parts by weight of toluene, followed by full dispersion.

After a curing agent was added to the magnetic coating composition, the composition was applied to a polyester film of 12 μm thick by gravure coating to a dry film thickness of 3 μm, surface smoothed, and cured by heating at 60° C. for 48 hours, obtaining a magnetic tape sample.

The magnetic tape sample was measured for magnetic properties, finding a coercive force Hc of 1,300 Oe and a saturated magnetic flux density Bm of 1,720 G. It had a Curie temperature of 145° C.

EXAMPLE 3

A magnetic disk was manufactured which had a magnetic layer containing ultrafine particles identified as sample No. 3 in Table 1.

A magnetic coating composition was prepared by adding the following ingredients:

|  | parts by weight |
| --- | --- |
| ultrafine particles | 100 |
| α-alumina fine particles | 10 |
| epoxy resin | 30 |
| phenol resin | 20 |
| vinyl resin | 10 | to 300 parts by weight of cyclohexanone and milling the mixture in a ball mill for 24 hours. Then further 200 parts by weight of cyclohexanone was added to the composition, which was milled for a further 48 hours.

The magnetic coating composition was spin coated on a aluminum substrate while rotating the substrate, and cured by heating at 200° C. for 2 hours, forming a magnetic coating. After the coating was polished to a thickness of 0.5 μm, the coated substrate was immersed in 10% by weight of perfluoropolyether in Freon solvent and pulled up therefrom at a rate of 15 mm/sec., forming a lubricating layer thereon.

The thus obtained magnetic disk was measured for magnetic properties, finding a coercive force Hc of 1,080 Oe and a saturated magnetic flux density Bm of 1,190 G. It had a Curie temperature of 145° C.

Examples 1 to 3 demonstrate the effectiveness of ultrafine particles of the invention.

The ultrafine particles of the invention have a high degree of sphericity and a smooth surface as seen from FIG. 1, a hexagonal $Fe_2P$ structure as seen from the x-ray diffraction pattern of FIG. 5, and a high coercive force and a high saturation magnetization as shown in Table 1. Ultrafine particles of sample No. 8 having a composition approximate to the stoichiometry have a coercive force as high as 3,900 Oe. Among the samples of the invention shown in Table 1, those samples having a lower P content than the stoichiometry have a coercive force at least equal to that of the $(Fe,Co)_2P$ intermetallic compound described in the above-cited Japanese Patent Publication Nos. 4755/1963, 5757/1964, and 11085/1983.

As seen from Table 1 and FIG. 6, the ultrafine particles of the invention show a sharp decline of coercive force with a temperature rise, indicating that the Curie temperature (a temperature corresponding to an extrapolated coercive force of zero) is lower than 200° C., say, in the range of from 90° to 160° C. This temperature property indicates that the ultrafine particles of the invention are not only suitable for magnetic recording, but also very useful for thermomagnetic recording media such as magneto-optical recording media. In general, the thermomagnetic recording mode like magnetooptical recording involves directing a laser beam to the recording medium to locally heat the medium to a temperature of about 150° C. under a weak magnetic field of up to about 200 Oe, thereby inducing magnetization reversal in the locally heated spot for recording. Under the conditions, the medium using ultrafine particles of the invention having a low Curie temperature provides efficient recording because the coercive force of the locally heated spot is reduced to below 200 Oe.

The recording medium having a recording layer containing ultrafine particles of the invention is suitable as a thermomagnetic recording medium because of a low Curie temperature while it offers satisfactory properties as conventional magnetic recording media.

EXAMPLE 4

A mixture of iron oxide powder, cobalt oxide powder, iron phosphate powder, and carbon black was milled and granulated by spray drying, obtaining a powder source material.

The powder source material was introduced into a reaction furnace as shown in FIG. 3 or 4 which was operated to produce a plasma jet whereby the material was evaporated into a vapor. The vapor was quenched and condensed with a cooling gas, obtaining ultrafine particles. Inclusion of nitrogen in the plasma gas resulted in particles containing nitrogen.

Table 2 shows the atomic ratios Fe/Co and (Fe+Co)/P, C content, and mean particle size of the powder source material, the plasma gas and plasma power, and the cooling gas. The plasma jet was generated by ICP for sample Nos. 12, 34, and 35 and by DC plasma for the remaining samples. The reaction furnace of FIG. 3 or 4 used a refractory material inner wall 23 of graphite and a heat insulating outer wall 24 of carbon fibers.

Table 2 also shows the atomic ratios Fe/Co and (Fe+Co)/P, C and N contents (% by weight based on the weight of particles), mean particle size, predominant crystalline structure, coercive force Hc at 25° C., saturation magnetization σs, squareness ratio SQ, and Curie temperature Tc of the ultrafine particles.

It is to be noted that in sample No. 12, the powder source material and the resulting ultrafine particles did not contain C and N.

Figure 2:
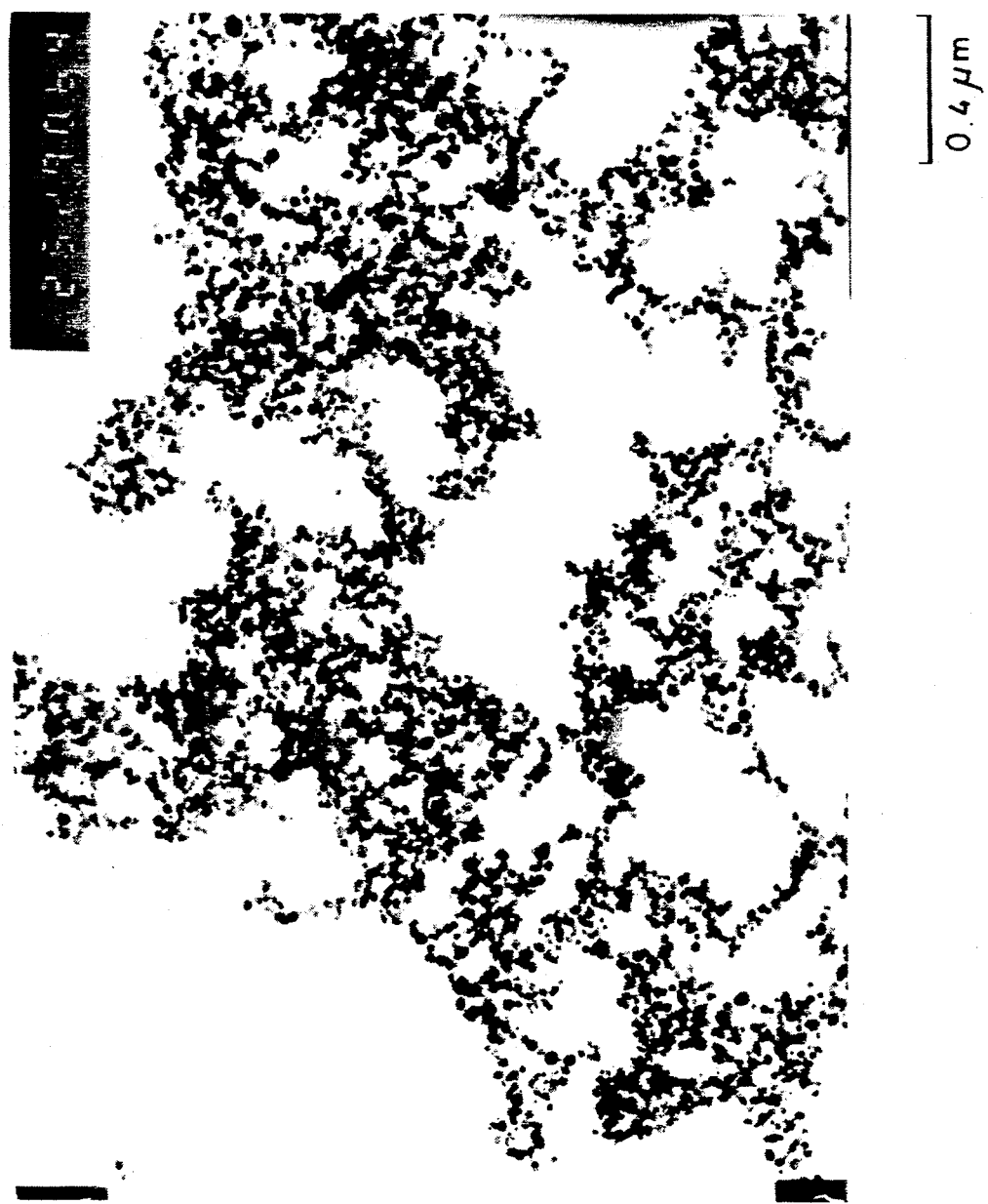

FIG. 2 shows the photomicrograph of sample No. 29 under a transmission electron microscope.

Figure 7:
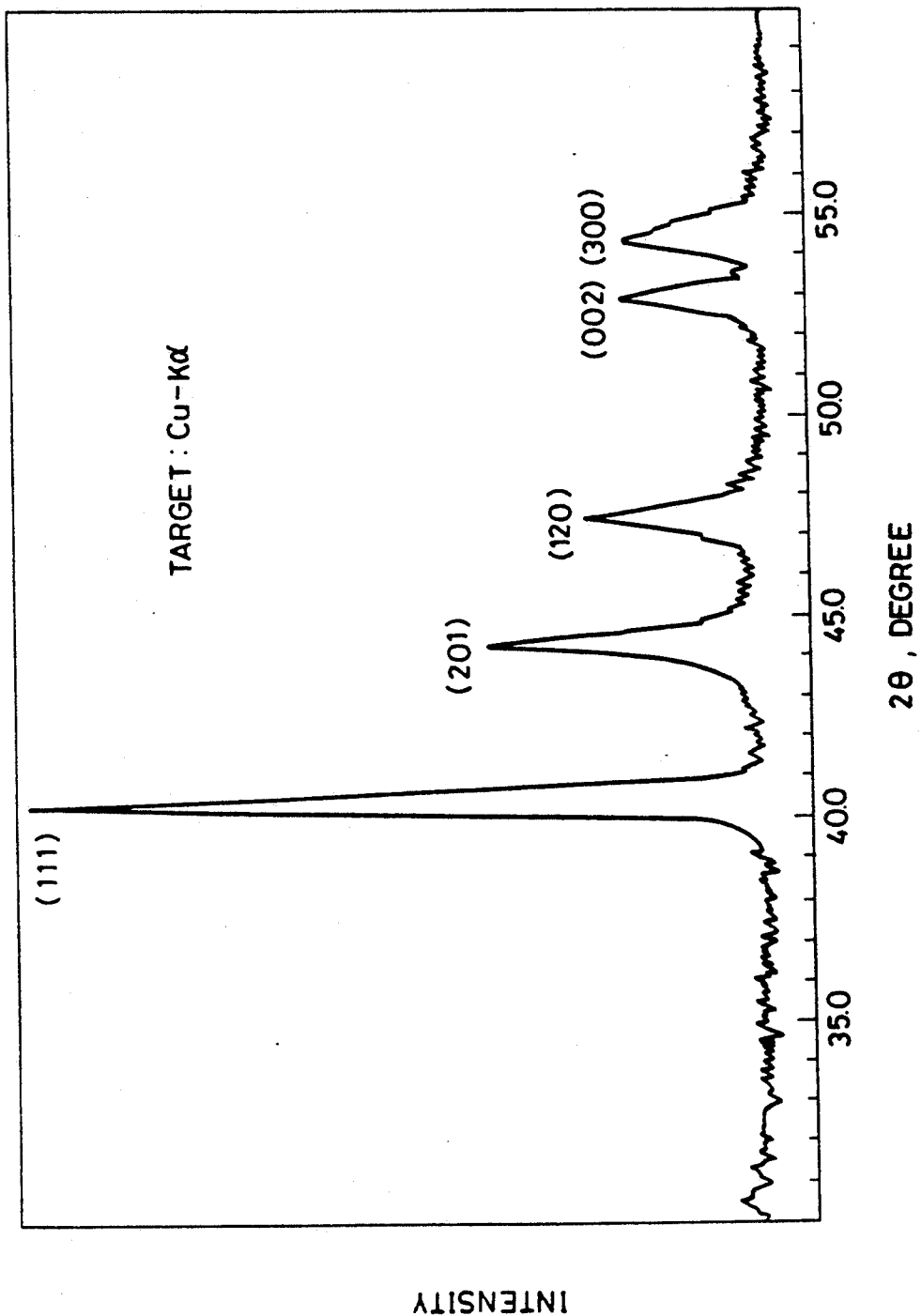

FIG. 7 is a x-ray diffraction pattern of sample No. 29.

Figure 8:
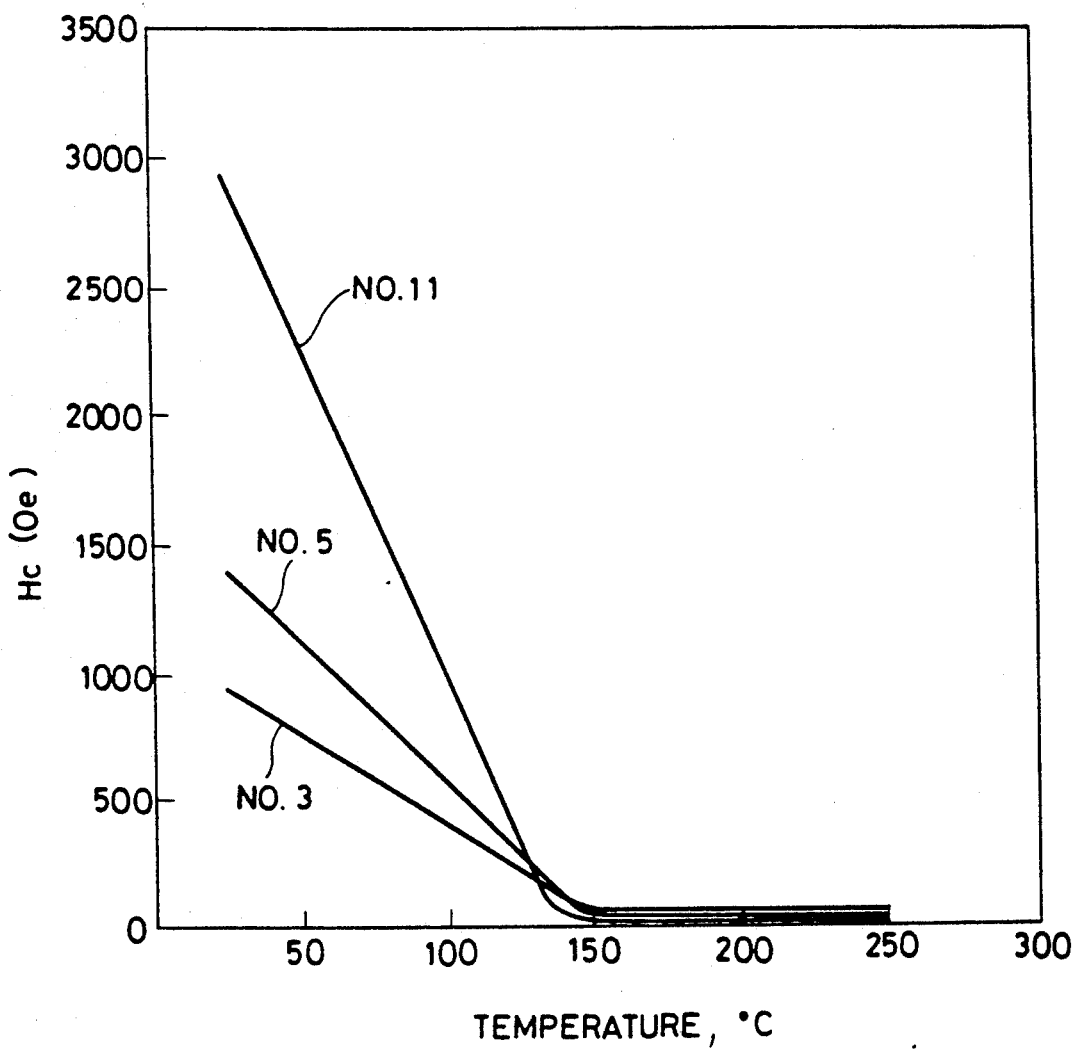

FIG. 8 shows the coercive force of sample Nos. 23, 25, and 31 as a function of temperature.

TABLE 2

| Sample No. | Powder source material | | | | | | | Ultrafine particles | | | |
| --- | --- | --- | --- | --- | --- | --- | --- | --- | --- | --- | --- |
| | | | | Particle | Plasma | | Cooling | Composition | | | |
| | Fe/Co | (Fe + Co)/P | C (wt %) | size (μm) | Power | Gas | gas | Fe/Co | (Fe + Co)/P | C (wt %) | N (wt %) |
| 21 | 84/16 | 81/19 | 15 | 10 | 20 | Ar + N$_2$ | N$_2$ | 84/16 | 82/18 | 4.4 | 1.4 |
| 22 | 84/16 | 80/20 | 15 | 10 | 20 | Ar + N$_2$ | N$_2$ | 84/16 | 80/20 | 4.4 | 1.6 |
| 23 | 84/16 | 80/20 | 15 | 10 | 19 | Ar + N$_2$ | N$_2$ | 84/16 | 78/22 | 4.2 | 1.4 |
| 24 | 84/16 | 77/23 | 30 | 10 | 18 | Ar + N$_2$ | N$_2$ | 85/15 | 76/24 | 4.2 | 1.7 |
| 12* | 85/15 | 76/24 | 0 | 10 | 40 | Ar + N$_2$ | N$_2$ | 85/15 | 76/24 | 0 | 0 |
| 25 | 84/16 | 79/21 | 30 | 10 | 15 | Ar + N$_2$ | N$_2$ | 86/14 | 74/26 | 4.2 | 1.9 |
| 26 | 84/16 | 77/23 | 30 | 10 | 15 | Ar + N$_2$ | N$_2$ | 86/14 | 71/29 | 4.1 | 1.6 |
| 27 | 84/16 | 75/25 | 25 | 10 | 18 | Ar + N$_2$ | N$_2$ | 85/15 | 69/31 | 3.3 | 1.3 |
| 28 | 84/16 | 74/26 | 30 | 10 | 18 | Ar + N$_2$ | N$_2$ | 85/15 | 68/32 | 3.2 | 1.3 |
| 29 | 84/16 | 73/27 | 10 | 10 | 18 | Ar + N$_2$ | N$_2$ | 85/15 | 67/33 | 2.6 | 1.1 |

TABLE 2-continued

| | | | | | | | | | | | |
|---|---|---|---|---|---|---|---|---|---|---|---|
| 30 | 85/15 | 80/20 | 10 | 10 | 17.5 | Ar + N$_2$ | N$_2$ | 85/15 | 74/26 | 2.9 | 1.1 |
| 31 | 86/14 | 78/22 | 30 | 10 | 15 | Ar + N$_2$ | N$_2$ | 85/15 | 69/31 | 5.1 | 0 |
| 32 | 90/10 | 77/23 | 5 | 10 | 20 | Ar + N$_2$ | N$_2$ | 90/10 | 76/24 | 3.4 | 1.3 |
| 33 | 85/15 | 76/24 | 25 | 10 | 20 | Ar + H$_2$ | H$_2$ | 85/15 | 72/28 | 5.5 | 0 |
| 34 | 85/15 | 70/30 | 0 | 10 | 40 | Ar + N$_2$ | N$_2$ | 85/15 | 70/30 | 0 | 1.5 |
| 35 | 85/15 | 68/32 | 0 | 10 | 40 | Ar + N$_2$ | N$_2$ | 85/15 | 67/33 | 0 | 2.0 |
| 102* | 86/14 | 91/9 | 40 | 10 | 18 | Ar + N$_2$ | N$_2$ | 85/15 | 88/12 | 5.6 | 1.1 |
| 103 | 85/15 | 78/22 | 60 | 10 | 16 | Ar + N$_2$ | N$_2$ | 85/15 | 71/29 | 10.4 | 0.9 |
| 104 | 85/15 | 79/21 | 30 | 10 | 18 | Ar + N$_2$ | NH$_3$ | 85/15 | 74/26 | 5.0 | 5.8 |

| Sample No. | Ultrafine particles | | | | |
|---|---|---|---|---|---|
| | Crystal structure | Hc (Oe) | $\sigma_s$ (emu/g) | SQ | Particle size (Å) | Tc (°C.) |
| 21 | Fe$_2$P | 600 | 88 | 0.38 | 240 | 155 |
| 22 | Fe$_2$P | 910 | 69 | 0.46 | 310 | 145 |
| 23 | Fe$_2$P | 940 | 71 | 0.47 | 305 | 145 |
| 24 | Fe$_2$P | 1240 | 67 | 0.49 | 295 | 140 |
| 12* | Fe$_2$P | 1090 | 72 | 0.47 | 350 | 145 |
| 25 | Fe$_2$P | 1400 | 69 | 0.50 | 320 | 145 |
| 26 | Fe$_2$P | 1850 | 62 | 0.52 | 300 | 140 |
| 27 | Fe$_2$P | 2510 | 57 | 0.55 | 280 | 140 |
| 28 | Fe$_2$P | 2910 | 52 | 0.55 | 245 | 135 |
| 29 | Fe$_2$P | 3280 | 52 | 0.57 | 290 | 135 |
| 30 | Fe$_2$P | 1400 | 64 | 0.51 | 315 | 140 |
| 31 | Fe$_2$P | 2950 | 51 | 0.55 | 250 | 135 |
| 32 | Fe$_2$P | 1090 | 62 | 0.47 | 360 | 90 |
| 33 | Fe$_2$P | 2430 | 54 | 0.51 | 270 | 140 |
| 34 | Fe$_2$P | 2800 | 50 | 0.55 | 300 | 140 |
| 35 | Fe$_2$P | 3500 | 48 | 0.57 | 290 | 140 |
| 102* | Fe$_3$P + αFe | 300 | 101 | 0.27 | 260 | 420 |
| 103 | Fe$_2$P | 760 | 55 | 0.33 | 260 | 150 |
| 104 | Fe$_2$P + Fe$_3$N | 1600 | 39 | 0.50 | 320 | 145 |

*outside the scope of the invention

EXAMPLE 5

Magnetic disks were manufactured which had a magnetic layer containing ultrafine particles identified as sample Nos. 24, 29, and 12 in Table 2.

A magnetic coating composition was prepared by adding the following ingredients:

| | parts by weight |
|---|---|
| ultrafine particles | 100 |
| α-alumina fine particles | 10 |
| epoxy resin | 30 |
| phenol resin | 20 |
| vinyl resin | 10 | to 300 parts by weight of cyclohexanone and milling the mixture in a ball mill for 24 hours. Then further 200 parts by weight of cyclohexanone was added to the composition, which was milled for a further 48 hours.

The magnetic coating composition was spin coated on a aluminum substrate while rotating the substrate, and cured by heating at 200° C. for 2 hours, forming a magnetic coating. After the coating was polished to a thickness of 0.5 μm, the coated substrate was immersed in 10% by weight of perfluoropolyether in Freon solvent and pulled up therefrom at a rate of 15 mm/sec., forming a lubricating layer thereon.

The thus obtained magnetic disks were measured for coercive force Hc and saturated magnetic flux density Bm. The disk samples were aged one day at 85° C. and RH 85% and again measured for saturated magnetic flux density Bm. A percent change ΔBm in saturated magnetic flux density before and after aging was calculated. The results are shown in Table 3.

TABLE 3

| Ultrafine particles No. | Disk's magnetic properties | | |
|---|---|---|---|
| | Hc (Oe) | Bm (G) | ΔBm (%) |
| 24 | 1290 | 1200 | 5 |
| 29 | 3400 | 1000 | 4 |
| 12 | 1130 | 1210 | 10 |

EXAMPLE 6

Magnetic tapes were manufactured which had a magnetic layer containing ultrafine particles identified as sample Nos. 33, 35, and 12 in Table 2.

A magnetic coating composition was prepared by adding the following ingredients:

| | parts by weight |
|---|---|
| ultrafine particles | 400 |
| vinyl chloride-vinyl acetate resin | 50 |
| urethane resin | 50 |
| stearic acid | 2 |
| butyl stearate | 2 | to 300 parts by weight of MEK, 250 parts by weight of MIBK, and 250 parts by weight of toluene, followed by full dispersion.

After a curing agent was added to the magnetic coating composition, the composition was applied to a polyester film of 12 μm thick by gravure coating to a dry film thickness of 3 μm, surface smoothed, and cured by heating at 60° C. for 48 hours, obtaining a magnetic tape sample.

The magnetic tape samples were measured for coercive force Hc and saturated magnetic flux density Bm as in Example 5.

The results are shown in Table 4.

TABLE 4

| Ultrafine particles No. | Tape's magnetic properties | | |
|---|---|---|---|
| | Hc (Oe) | Bm (G) | ΔBm (%) |
| 33 | 2450 | 1320 | 5 |
| 35 | 3600 | 1210 | 3 |
| 12 | 1140 | 1715 | 15 |

Example 4 to 6 demonstrate the effectiveness of inclusion of C and N in ultrafine particles.

The ultrafine particles of the invention have a high degree of sphericity and a smooth surface as seen from FIG. 2, a hexagonal $Fe_2P$ structure as seen from the x-ray diffraction pattern of FIG. 7, and a high coercive force and a high saturation magnetization as shown in Table 2. Among the samples of the invention shown in Table 2, those samples having a lower P content than the stoichiometry have a coercive force at least equal to that of the $(Fe,Co)_2P$ intermetallic compound described in the above-cited Japanese Patent Publication Nos. 4755/1963, 5757/1964, and 11085/1983.

As seen from Table 3, ultrafine particle sample No. 24 of the invention containing C and N had higher corrosion resistance than sample No. 12 which had the same composition except the absence of C and N. Additionally, sample No. 24 had a higher coercive force than sample No. 12.

As seen from Table 2 and FIG. 8, the ultrafine particles of the invention show a sharp decline of coercive force with a temperature rise, indicating that the Curie temperature (a temperature corresponding to an extrapolated coercive force of zero) is lower than 200° C., say, in the range of from 90° to 160° C. This temperature property indicates that the ultrafine particles of the invention are not only suitable for magnetic recording, but also very useful for thermomagnetic recording media such as magnetooptical recording media.

EXAMPLE 7

Preparation of ultrafine particles

A mixture of iron oxide powder, cobalt oxide powder, iron phosphate powder, and carbon black was milled and granulated by spray drying, obtaining a powder source material.

The powder source material was introduced into a reaction furnace as shown in FIGS. 3 or 4 which was operated to produce a plasma jet whereby the material was evaporated into a vapor. The vapor was quenched and condensed with a cooling gas, obtaining ultrafine particles. Inclusion of nitrogen in the plasma gas resulted in particles containing nitrogen.

Table 5 shows the atomic ratios Fe/Co and (Fe+Co)/P, C content, and mean particle size of the powder source material, the plasma gas and plasma power, and the cooling gas. The plasma jet was generated by DC plasma except sample No. 41 by ICP.

Table 5 also shows the atomic ratios Fe/Co and (Fe+Co)/P, C and N contents, mean particle size, predominant crystalline structure, coercive force Hc at 25° C., saturation magnetization $\sigma_s$, squareness ratio SQ, and Curie temperature Tc of the ultrafine particles.

TABLE 5

| Sample No. | Powder source material | | | Plasma | | Cooling gas | Ultrafine particles Composition | | | |
|---|---|---|---|---|---|---|---|---|---|---|
| | Fe/Co | (Fe + Co)/P | C (wt %) | Power (KW) | Gas | | Fe/Co | (Fe + Co)/P | C (wt %) | N (wt %) |
| 41 | 85/15 | 78/22 | 0 | 40 | Ar + H₂ | H₂ | 85/15 | 76/24 | 0 | 0 |
| 42 | 84/16 | 75/25 | 25 | 18 | Ar + N₂ | N₂ | 85/15 | 69/31 | 3.3 | 1.3 |
| 43 | 86/14 | 78/22 | 30 | 15 | Ar + N₂ | H₂ | 85/15 | 69/31 | 5.1 | 0 |
| 44 | 85/15 | 68/32 | 0 | 19 | Ar + N₂ | N₂ | 85/15 | 67/33 | 0 | 2 |
| 45 | 85/15 | 70/30 | 30 | 18 | Ar + N₂ | N₂ | 85/15 | 65/35 | 4.5 | 0.5 |

| Sample No. | Ultrafine particles | | | | |
|---|---|---|---|---|---|
| | Crystal structure | Hc (Oe) | $\sigma_s$ (emu/g) | Particle size (Å) | Tc (°C.) |
| 41 | Fe₂P | 1210 | 69 | 330 | ≈145 |
| 42 | Fe₂P | 2510 | 57 | 250 | ≈140 |
| 43 | Fe₂P | 2950 | 51 | 270 | ≈135 |
| 44 | Fe₂P | 3500 | 48 | 290 | ≈140 |
| 45 | Fe₂P | 3950 | 36 | 310 | ≈135 |

Preparation of thermomagnetic printing tape

Thermomagnetic printing tapes were manufactured which had a thermomagnetic layer containing the ultrafine particles identified in Table 5.

A magnetic coating composition was prepared by milling the following ingredients:

| | parts by weight |
|---|---|
| ultrafine particles | 100 |
| vinyl chloride-vinyl acetate resin | 17 |
| urethane resin | 17 |
| stearic acid | 2 |
| toluene | 80 |
| MIBK | 80 |
| MEK | 95 |

The magnetic coating composition was applied to a polyester film of 12 μm thick, dried, calendered, and severed to a transverse distance of ½ inch, obtaining a thermomagnetic printing tape sample. For some samples, the coatings were dried in a magnetic field of 6,000 Oe for orientation of ultrafine particles. The orienting magnetic field was in either a longitudinal or perpendicular direction of the tape.

Table 6 shows the coercive force Hc and squareness ratio SQ in a longitudinal direction and coating thickness of the printing tape samples.

For those samples which experienced orientation in a magnetic field perpendicular to the tape surface, the squareness ratio in a perpendicular direction is reported.

TABLE 6

| Transfer tape | Ultrafine particles No. | Hc (Oe) | SQ | Coating thickness (μm) | Magnetic Orientation |
| --- | --- | --- | --- | --- | --- |
| A | 41 | 1250 | 0.76 | 2 | longitudinal |
| B | 42 | 2590 | 0.50 | 1.8 | no orientation |
| C | 43 | 3040 | 0.80 | 2.5 | longitudinal |
| D | 44 | 3570 | 0.50 | 1.5 | no orientation |
| E | 45 | 4080 | 0.75 | 2.1 | perpendicular |

For comparison purposes, a printing tape sample was manufactured using $CrO_2$ magnetic particles. A magnetic coating composition was prepared by milling needle $CrO_2$ magnetic particles having a coercive force of 650 Oe, a Curie temperature of 125° C., an average length of 0.3 μm, and an average aspect ratio of 6 with the following ingredients.

| | parts by weight |
| --- | --- |
| $CrO_2$ particles | 100 |
| α—$Al_2O_3$ | 0.5 |
| myristic acid | 0.5 |
| n-butyl stearate | 0.7 |
| vinyl chloride-vinyl acetate resin | 12 |
| urethane resin | 12 |
| MIBK | 100 |
| cyclohexanone | 100 |
| THF | 100 |

The magnetic coating composition was applied to a polyester film of 12 μm thick, dried, calendered, and severed to a transverse distance of ½ inch, obtaining a thermomagnetic printing tape sample designated sample F.

The printing samples A to F were measured for thermomagnetic printing properties. Using a metal tape having a coercive force of 1,500 Oe as a master tape and a Sendust magnetic head having a gap spacing of 0.2 μm, sine wave signals at 11.6 MHz (wavelength 0.5 μm) were recorded at a head-tape relative speed of 5.8 m/sec. The signals in the master tape were then transferred to a printing tape sample by means of a thermomagnetic printing equipment. Finally the printed signals were reproduced to measure the output. The reproduction output of the respective samples is shown in Table 7.

TABLE 7

| Transfer tape | Reproduction output (dB) |
| --- | --- |
| A | +1 |
| B | +4 |
| C | +5 |
| D | +6 |
| E | +6.5 |
| F | 0 |

Example 7 demonstrates the effectiveness of ultrafine particles of the invention for thermomagnetic recording.

According to the present invention, a powder source material containing at least the essential elements Fe and Co, and often P in elemental or compound form is instantaneously evaporated. It is possible to evaporate Fe, Co, P and other elements having different melting and boiling points at the same time. By quenching the vapor, there are readily obtained ultrafine particles predominantly based on a hexagonal $Fe_2P$ structure and having improved magnetic properties. A hexagonal $Fe_2P$ structure is available over a wide range of Fe—Co—P composition. This in turn means that magnetic properties can be readily controlled within a practical range by varying the proportion of Fe, Co and P in the composition.

The ultrafine particles of the invention become more dispersing when they contain C. The ultrafine particles of the invention become free of fusion bonding into an interconnected particle chain when they contain C or N. Inclusion of C or N also contributes to an increased corrosion resistance, increased coercive force, and reduced Curie temperature.

The ultrafine particles of the invention are substantially spherical. When a coated magnetic recording medium is constructed from the ultrafine particles, a perpendicular magnetizable component thereof can be effectively utilized. The medium is then suitable for short wavelength recording, that is, high density recording. Since ultrafine spherical particles are not oriented by simple coating at all, they are suitable as the recording material for magnetic disks, especially floppy disks. In addition, because of their Curie temperature as low as 90° to 160° C., the ultrafine particles are adapted for thermomagnetic recording as typified by magnetooptical recording.

The method of the invention is easy to directly produce ultrafine, substantially spherical particles having improved properties as mentioned above. When low purity materials such as scraps, ores, and mill scales are used as the source material, the cost of manufacture is reduced.

The thermomagnetic printing medium of the invention allows for simple, efficient and safe printing of magnetic information signals having a short recording wavelength.

Although some preferred embodiments have been described, many modifications and variations may be made thereto in the light of the above teachings. It is therefore to be understood that within the scope of the appended claims, the invention may be practiced otherwise than as specifically described.

We claim:

1. A magnetic recording medium comprising a recording layer including ferromagnetic ultrafine substantially hexagonal crystalline $Fe_2P$ particles of substantially spherical shape having a means particle size of 0.005–0.1 μm consisting essentially of iron, cobalt, and phosphorus in a Fe/Co atomic ratio of from 95/5 to 70/30 and a (Fe+Co)/P atomic ratio of from 85/15 to 60/40, the particles being prepared by gas phase reaction, and wherein at least one of carbon and nitrogen stabilize said hexagonal $Fe_2P$ structure.

2. A magnetic recording medium comprising a recording layer including ferromagnetic ultrafine substantially hexagonal crystalline $Fe_2P$ particles of substantially spherical shape having a mean particle size of 0.005–0.1 μm comprising iron, cobalt, phosphorus and at least one of carbon and nitrogen to stabilize said hexagonal $Fe_2P$ structure in an amount of at least 0.1% by weight.

3. A thermomagnetic recording medium comprising a recording layer including ferromagnetic ultrafine substantially hexagonal crystalline $Fe_2P$ particles of substantially spherical shape having a means particle size of 0.005–0.1 μm consisting essentially of iron, cobalt, and phosphorus in a Fe/Co atomic ratio of from 95/5 to 70/30 and a (Fe+Co)/P atomic ratio of from 85/15 to 60/40, the particles being prepared by gas phase reaction, and wherein at least one of carbon and nitrogen stabilize said hexagonal Fe$_2$P structure.

4. A thermomagnetic recording medium comprising a recording layer including ferromagnetic ultrafine substantially hexagonal crystalline Fe$_2$P particles of substantially spherical shape having a mean particle size of 0.005–0.1 μm comprising iron, cobalt, phosphorus and at least one of carbon and nitrogen to stabilize said hexagonal Fe$_2$P structure in an amount of at least 0.1% by weight.

5. A thermomagnetic printing medium comprising a recording layer including ferromagnetic ultrafine substantially hexagonal crystalline Fe$_2$P particles of substantially spherical shape having a mean particle size of 0.005–0.1 μm consisting essentially of iron, cobalt, and phosphorus in a Fe/Co atomic ratio of from 95/5 to 70/30 and a (Fe+Co)/P atomic ratio of from 85/15 to 60/40, the particles being prepared by gas phase reaction, and wherein at least one of carbon and nitrogen stabilize said hexagonal Fe$_2$P structure.

6. A thermomagnetic printing recording medium comprising a recording layer including ferromagnetic ultrafine substantially crystalline Fe$_2$P particles of substantially spherical shape having a means particle size of 0.005–0.1 μm comprising iron, cobalt, phosphorus and at least one of carbon and nitrogen to stabilize said hexagonal Fe$_2$P structure.

* * * * *

UNITED STATES PATENT AND TRADEMARK OFFICE
CERTIFICATE OF CORRECTION

PATENT NO. : 5,256,479
DATED : October 26, 1993
INVENTOR(S) : Yasumichi Tokuoka, et al It is certified that error appears in the above-indentified patent and that said Letters Patent is hereby corrected as shown below:

Column 20, lines 45,64 and Column 22, line 10:
Claim 1, 3, and 6, line 4, of each, "means"
should read --mean--.

Signed and Sealed this

Twenty-fourth Day of May, 1994

Attest:

BRUCE LEHMAN

*Attesting Officer*        *Commissioner of Patents and Trademarks*